US011206021B2

(12) United States Patent
Agan et al.

(10) Patent No.: US 11,206,021 B2
(45) Date of Patent: Dec. 21, 2021

(54) QUASI-ADIABATIC LOGIC CIRCUITS

(71) Applicants: Tommy Allen Agan, Maple Grove, MN (US); James John Lupino, St. Louis Park, MN (US)

(72) Inventors: Tommy Allen Agan, Maple Grove, MN (US); James John Lupino, St. Louis Park, MN (US)

(73) Assignee: TACHO HOLDINGS, LLC, St. Louis Park, MN (US)

( * ) Notice: Subject to any disclaimer, the term of this patent is extended or adjusted under 35 U.S.C. 154(b) by 0 days.

(21) Appl. No.: 17/053,770

(22) PCT Filed: May 8, 2019

(86) PCT No.: PCT/US2019/031338
§ 371 (c)(1),
(2) Date: Nov. 7, 2020

(87) PCT Pub. No.: WO2019/217566
PCT Pub. Date: Nov. 14, 2019

(65) Prior Publication Data
US 2021/0265997 A1    Aug. 26, 2021

Related U.S. Application Data

(60) Provisional application No. 62/668,259, filed on May 8, 2018.

(51) Int. Cl.
*H03K 19/00* (2006.01)
(52) U.S. Cl.
CPC .............................. *H03K 19/0019* (2013.01)

(58) Field of Classification Search
None
See application file for complete search history.

(56) References Cited

U.S. PATENT DOCUMENTS 5,670,899 A    9/1997  Kohdaka
5,701,093 A *  12/1997  Suzuki ............... H03K 19/0019
                                                                326/21

(Continued)

OTHER PUBLICATIONS

International Search Report and Written Opinion dated Jul. 23, 2019. received for corresponding PCT Application No. PCT/US19/31338.

(Continued)

*Primary Examiner* — Jany Richardson
(74) *Attorney, Agent, or Firm* — Kinney & Lange, P.A.

(57) ABSTRACT

Apparatus and associated methods relate to quasi-adiabatic logic gates in which at least one supply terminal receives sinusoidal power. The quasi-adiabatic logic gate is configured to perform a specific logic function operative upon one or more input signals. When the quasi-adiabatic logic gate switches the output from one logic state to another logic state, the transient switching portion of the output signal substantially tracks the sinusoidal supply signal. Such a sinusoidal transient switching portion of the signal has lower frequency components than have traditional CMOS logic gate transients. Some embodiments include an inductor through which the sinusoidal supply signal is provided to the quasi-adiabatic logic gate. Such an inductor can both provide charge to and recover charge from switching quasi-adiabatic logic gates, thereby further reducing power.

23 Claims, 5 Drawing Sheets

QUASI-ADIABATIC CMOS INVERTER-1 GATE (56) References Cited

U.S. PATENT DOCUMENTS

| | | | |
|---|---|---|---|
| 5,841,299 A | 11/1998 | De | |
| 2002/0030533 A1 | 3/2002 | De et al. | |
| 2010/0073029 A1* | 3/2010 | Hong | H03K 19/0963 326/98 |
| 2011/0121813 A1* | 5/2011 | Sato | H03K 19/0963 323/349 |
| 2012/0306536 A1 | 12/2012 | Shukh et al. | |
| 2014/0062532 A1 | 3/2014 | Despont et al. | |

OTHER PUBLICATIONS

International Preliminary Report on Patentability and Written Report dated Nov. 10, 2020, received for corresponding PCT Application No. PCT/US2019/031338, 7 pages.

\* cited by examiner

QUASI-ADIABATIC LOGIC CIRCUITS

CROSS-REFERENCE TO RELATED APPLICATION(S)

This application is the national phase of PCT Application No. PCT/US19/31338 filed on May 8, 2019, which in turn claims priority to U.S. Provisional Application No. 62/668,259, by James John Lupino and Tommy Allen Agan, filed May 8, 2018, titled "Quasi-Adiabatic Logic and Circuitry," which is incorporated herein by reference in its entirety.

BACKGROUND

Conventional CMOS logic circuits are powered between two DC power buses. The CMOS logic circuits are configured to perform specific logic functions based on input signals received thereby. When the input signals change such that the output signal indicative of the logic function operating on such signals must change, the output rapidly changes states. Such rapid transient portions of the output signal can cause pulses of current with high peak magnitudes. Such high peak current magnitudes can cause the supplies to momentarily collapse. Furthermore, during the transient portions of switching, both pullup and pulldown circuitry can be conductively providing a path for current to flow directly from one supply to another supply. Such current is sometimes called crowbar current. Crowbar current is wasted, in that such current is not used to charge parasitic capacitance of the subsequent logic gates.

SUMMARY

Apparatus and associated methods relate to a quasi-adiabatic CMOS logic gate that includes first and second clock input terminals configured to receive complementary first and second sinusoidal clock signals, respectively. The quasi-adiabatic CMOS logic gate includes one or more logic input terminals configured to receive one or more corresponding logic input signals. The quasi-adiabatic CMOS logic gate includes a logic output terminal configured to output a logic output signal. The quasi-adiabatic CMOS logic gate includes a pullup network including one or more PMOS devices configured to perform a pullup logic function. Each of the one or more devices of the pullup network has a control node coupled to a corresponding one of the logic input terminals. The pullup network is configured to modulate conductivity between a first supply node and an intermediate pullup node based on the pullup logic function that the pullup network is configured to perform and the logic input signals received on the logic input terminals. The quasi-adiabatic CMOS logic gate includes a pulldown network including one or more NMOS devices configured to perform a pulldown logic function that is the complement of the pullup logic function performed by the pullup network. Each of the one or more devices of the pulldown network has a control node coupled to a corresponding one of the logic input terminals. The pulldown network is configured to modulate conductivity between a second supply node and an intermediate pulldown node based on the pulldown logic function that the pulldown network is configured to perform and the logic input signals received on the logic input terminals. The quasi-adiabatic CMOS logic gate includes a pullup clocking device having a pullup control node coupled to the first clock terminal. The pullup clocking device configured to modulate conductivity, based on a first sinusoidal clock signal received on the first clock terminal, between the intermediate pullup node and a logic output terminal. The quasi-adiabatic CMOS logic gate includes a pulldown clocking device having a pullup control node coupled to the second clock terminal. The pulldown clocking device configured to modulate conductivity, based on a second sinusoidal clock signal received on the second clock terminal, between the intermediate pulldown node and a logic output terminal. The first supply node is sinusoidally driven by a first supply signal in phase with the second sinusoidal clock signal. The second supply node is sinusoidally driven by a second supply signal in phase with and the first clock signal.

Some embodiments relate to a method for generating an electronic logic state. The method includes receiving, via first and second clock input terminals, complementary first and second sinusoidal clock signals, respectively. The method includes receiving, via one or more logic input terminals, one or more corresponding logic input signals. The method includes configuring a pullup network to perform a pullup logic function. The method includes modulating conductivity, via the pullup network, between a first supply node and an intermediate pullup node based on the pullup logic function that the pulldown network is configured to perform and the logic input signals received on the logic input terminals. The method includes configuring a pulldown network including one or more NMOS devices to perform a pulldown logic function that is the complement of the pullup logic function performed by the pullup network. The method includes modulating conductivity, via the pulldown network, between a second supply node and an intermediate pulldown node based on the pulldown logic function that the pulldown network is configured to perform and the logic input signals received on the logic input terminals. The method includes modulating conductivity, via a pullup clocking device having a pullup control node, between the intermediate pullup node and a logic output terminal based on a signal received on the pullup control node. The method includes modulating conductivity, via a pulldown clocking device having a pulldown control node, between the intermediate pulldown node and the logic output terminal based on a signal received on the pulldown control node. The method includes sinusoidally driving the first supply node by a first supply signal in phase with the second sinusoidal clock signal. The method includes sinusoidally driving the second supply node by a second supply signal in phase with and the first clock signal. The method also includes outputting a logic output signal at a logic output terminal

DETAILED DESCRIPTION

Apparatus and associated methods relate to quasi-adiabatic logic gates in which at least one supply terminal receives sinusoidal power. The quasi-adiabatic logic gate is configured to perform a specific logic function operative upon one or more input signals. When the quasi-adiabatic logic gate switches the output from one logic state to another logic state, the transient switching portion of the output signal substantially tracks the sinusoidal supply signal. Such a sinusoidal transient switching portion of the signal has lower frequency components than have traditional CMOS logic gate transients. Some embodiments include an inductor through which the sinusoidal supply signal is provided to the quasi-adiabatic logic gate. Such an inductor can both provide charge to and recover charge from switching quasi-adiabatic logic gates, thereby further reducing power.

Figure 1:
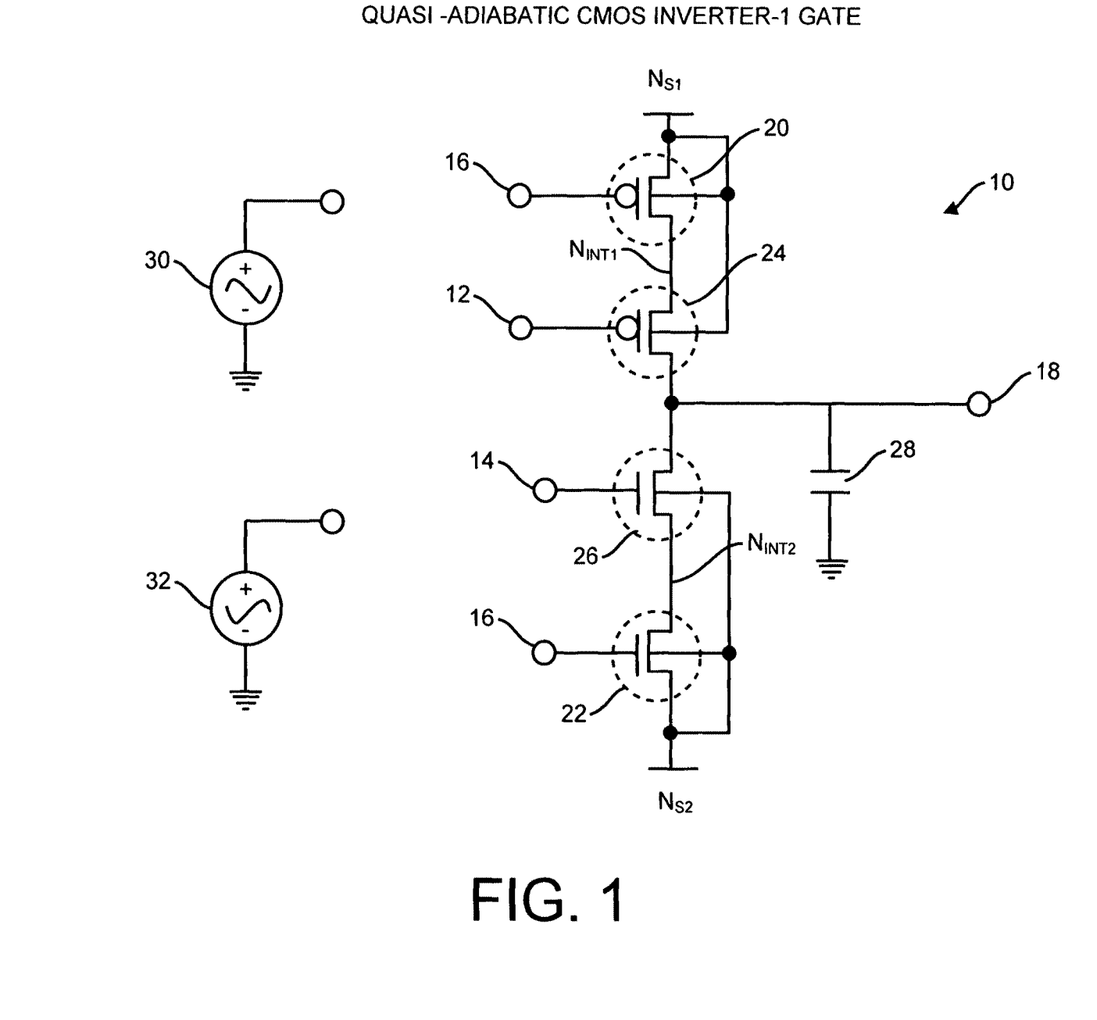
FIG. 1 is a schematic diagram of a quasi-adiabatic CMOS inverter.

FIG. 1 is a schematic diagram of a quasi-adiabatic CMOS inverter. In FIG. 1, quasi-adiabatic inverter 10 has first and second clock input terminals 12 and 14, logic input terminal 16, and logic output terminal 18. Quasi-adiabatic inverter 10 includes pullup network 20, pulldown network 22, pullup clocking device 24, and pulldown clocking device 26. Capacitor 28 can represent parasitic capacitances associated with logic output terminal 18, such as, for example, drain capacitances associated with pullup and pulldown clocking devices 24 and 26, metallization capacitances, and gate capacitances associated with logic gates connected to logic output terminal 18. Also depicted are complementary sinusoidal supplies 30 and 32.

Pullup network 20 and pulldown network 22 are simply a PMOS and NMOS Field Effect Transistor (FET), respectively. Such PMOS and NMOS devices are configured to provide an inverter logic function. Because logic gate 10 is configured to invert a logic signal, control nodes (e.g., gates of the PMOS and NMOS devices) for both pullup and pulldown networks 20 and 22 are conductively coupled to input logic terminal 16. For more complicated logic functions, pullup and pulldown networks 20 and 22 can include more than a single FET. For example, a two input NAND gate could be realized using two parallel connected NMOS FETs for pulldown network 22 and two series connected PMOS FETs for pullup network 20. Pullup and pulldown networks 20 and 22 are complementary, in that either one or the other, but not both, provides a conduction path between output terminal 18 and its respective supply node $N_{S1}$ or $N_{S2}$.

Pullup network 20 is configured to modulate conductivity between first supply node $N_{S1}$ and intermediate pullup node $N_{INT1}$ based on the pullup logic function that pullup network 20 is configured to perform and the logic input signals received on logic input terminal 16. Similarly, pulldown network 22 is configured to modulate conductivity between second supply node $N_{S2}$ and intermediate pulldown node $N_{INT2}$ based on the pulldown logic function that pulldown network 22 is configured to perform and the logic input signals received on logic input terminal 16.

Pullup clocking device 24 has a pullup control node (e.g., the gate of the depicted PMOS device) coupled to first clock input terminal 12. Pullup clocking device 24 is configured to modulate conductivity, based on a first sinusoidal clock signal received on first clock input terminal 12, between intermediate pullup node $N_{INT1}$ and logic output terminal 18. Pulldown clocking device 26 has a pulldown control node (e.g., the gate of the depicted NMOS device) coupled to second clock input terminal 14. Pulldown clocking device 26 is configured to modulate conductivity, based on a second sinusoidal clock signal received on second clock input terminal 14, between intermediate pulldown node $N_{INT2}$ and logic output terminal 18.

What renders the above described logic gate 10 a quasi-adiabatic logic gate is the non-DC supply signal applied to either or both of supply nodes $N_{S1}$ and $N_{S2}$. As depicted in FIG. 1, complementary sinusoidal supply signals are generated by complementary sinusoidal supplies 30 and 32. First supply node $N_{S1}$ is sinusoidally driven by a first supply signal in phase with the second sinusoidal clock signal received on second clock input terminal 14. In some embodiments, first supply node $N_{S1}$ can be conductively coupled to second clock input terminal 14. Second supply node $N_{S2}$ is sinusoidally driven by a second supply signal in phase with and the first clock signal received on first clock input terminal 12. In some embodiments, second supply node $N_{S2}$ can be conductively coupled to first clock input terminal 12.

In some embodiments the first and second supply signals can be complementary in that each of the first and second supply signals sinusoidally oscillate between the same DC voltage levels (e.g., VDD and VSS), but are approximately 180 degrees out of phase with one another. In some embodiments, only the first supply signal is non-DC. In other embodiments, only the second supply signal is non-DC. In some embodiments, first and second supply signals are sinusoids that are approximately 180 degrees out of phase with one another, but oscillate between voltage levels that are different for each of the first and second supply signals. For example the first supply signal can oscillate between VDD and a mid-level supply (e.g., the mean voltage between VDD and VSS). The second supply signal can then oscillate between the mid-level supply and VSS.

In some embodiments, the non-DC signal can be something other than sinusoidal. For example, in some embodiments, a non-DC signal can be created in a step-wise fashion. The stepwise signal can mimic a sinusoid or some other non-DC waveform. In some embodiments, a triangular or trapezoidal waveform can be used to provide power to quasi-adiabatic logic gates.

In some embodiments, the bodies of the devices of pullup network 20 and pullup clocking device 24 can be conductively coupled to first supply node $N_{S1}$ as depicted. In other embodiments, the bodies of the devices of pullup network 20 and pullup clocking device 24 can be conductively coupled to another biasing node. For example, the bodies of the devices of pullup network 20 and pullup clocking device 24 can be conductively coupled to VDD. In other embodiments the bodies of the devices of pullup network 20 and pullup clocking device 24 can be conductively coupled via diodes to both first supply node $N_{S1}$ and output logic terminal 18. Such a diode connection can ensure that the bodies of the devices of pullup network 20 and pullup clocking device 24 are not more than one diode voltage level below the voltage level of whichever of first supply node $N_{S1}$ and output logic terminal 18 that has the more positive voltage level.

Similarly, the bodies of the devices of pulldown network 22 and pulldown clocking device 26 can be conductively coupled via diodes to both second supply node $N_{S2}$ and output logic terminal 18. Such a diode connection can ensure that the bodies of the devices of pulldown network 22 and pulldown clocking device 26 are not more than one diode voltage level above the voltage level of whichever of second supply node $N_{S2}$ and output logic terminal 18 that has the more negative voltage level.

Figure 2:
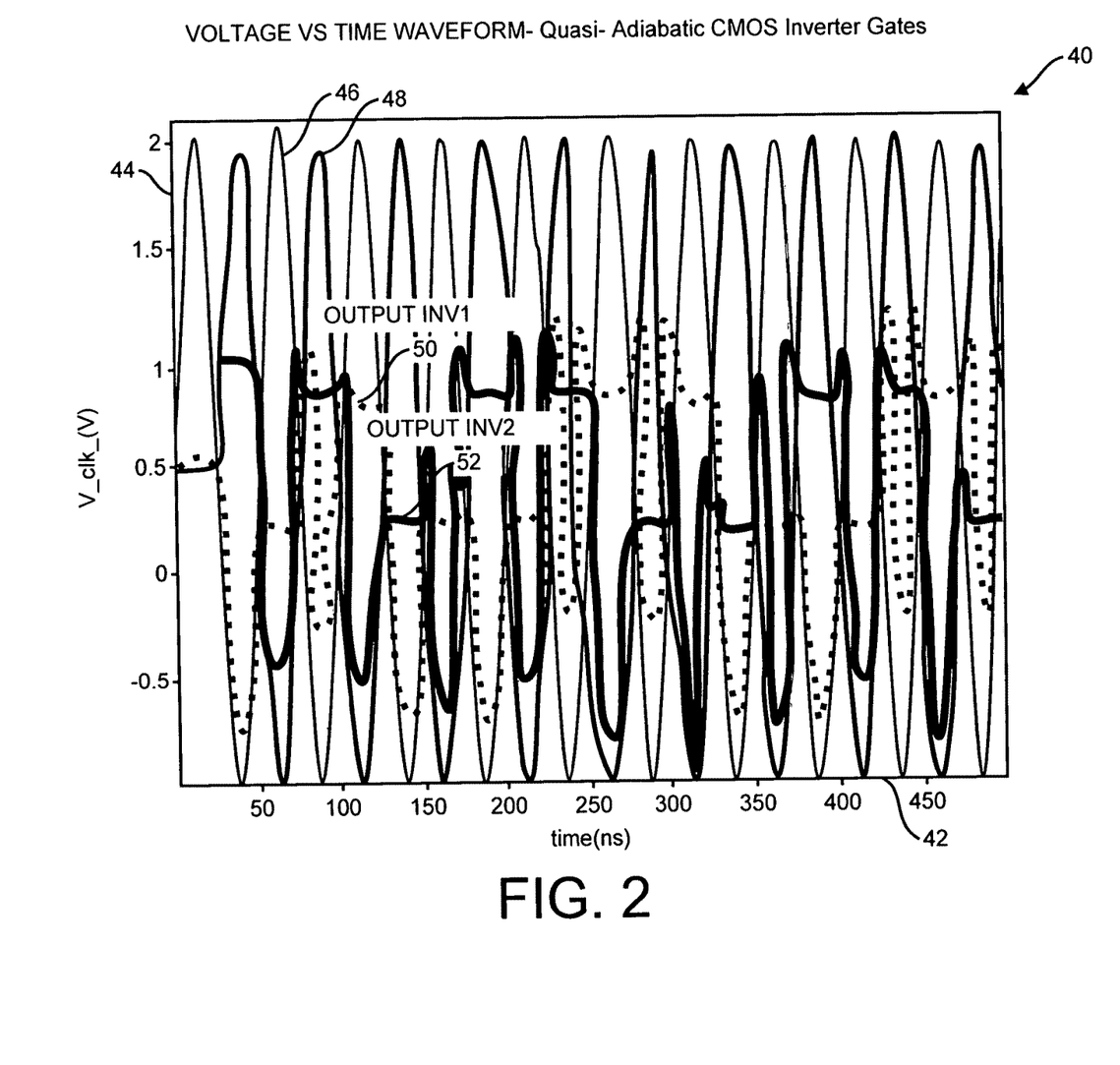
FIG. 2 is a graph of input and output signals of two series-connected quasi-adiabatic CMOS inverters, such as is depicted in FIG. 1.

FIG. 2 is a graph of input and output signals of two series-connected quasi-adiabatic CMOS inverters, such as is depicted in FIG. 1. Each of the two series-connected quasi-adiabatic CMOS inverters is provided sinusoidal supply signals and sinusoidal clock signals that are out of phase with one another. For example, the first sinusoidal clock signal is provided to first clock terminal 12 of the first of the two series-connected quasi-adiabatic CMOS inverters, but to second clock terminal 14 of the second of the two series-connected quasi-adiabatic CMOS inverters. Conversely, the second sinusoidal clock signal is provided to second clock terminal 14 of the first of the two series-connected quasi-adiabatic CMOS inverters, but to first clock terminal 12 of the second of the two series-connected quasi-adiabatic CMOS inverters.

Similarly, the first supply signal is provided to first supply node$_{NS1}$ of the first of the two series-connected quasi-adiabatic CMOS inverters, but to second supply node$_{NS2}$ of the second of the two series-connected quasi-adiabatic CMOS inverters. Lastly, the second supply signal is provided to second supply node $N_{S2}$ of the first of the two series-connected quasi-adiabatic CMOS inverters, but to first supply node $N_{S1}$ of the second of the two series-connected quasi-adiabatic CMOS inverters. In this way, the second of the two series-connected quasi-adiabatic CMOS inverters transitions between logic states 180 degrees after the first of the two series-connected quasi-adiabatic CMOS inverters transitions between logic states.

In FIG. 2, graph 40 includes horizontal axis 42, vertical axis 44, and voltage/time relations 46, 48, 50 and 52. Horizontal axis 42 is indicative time, and vertical axis 44 is indicative of voltage. Voltage/time relation 46 is indicative of a first sinusoidal supply signal, that oscillates between VDD and VSS (2.0 volts and zero volts, respectively, in the graph depicted). Voltage/time relation 48 is indicative of a second sinusoidal supply signal, that oscillates between VDD and VSS. Voltage/time relations 46 and 48 are complementary in that they are 180 degrees out of phase with one another.

Voltage/time relation 50 is indicative of the output voltage of a first of the two series-connected quasi-adiabatic CMOS inverters. Voltage/time relation 52 is indicative of the output voltage of a second of the two series-connected quasi-adiabatic CMOS inverters. As is depicted in FIG. 2, the output logic signal indicated by voltage/time relation 50 is sufficient to cause the second of the series-connected quasi-adiabatic CMOS inverters to produce a proper output signal.

Figure 3:
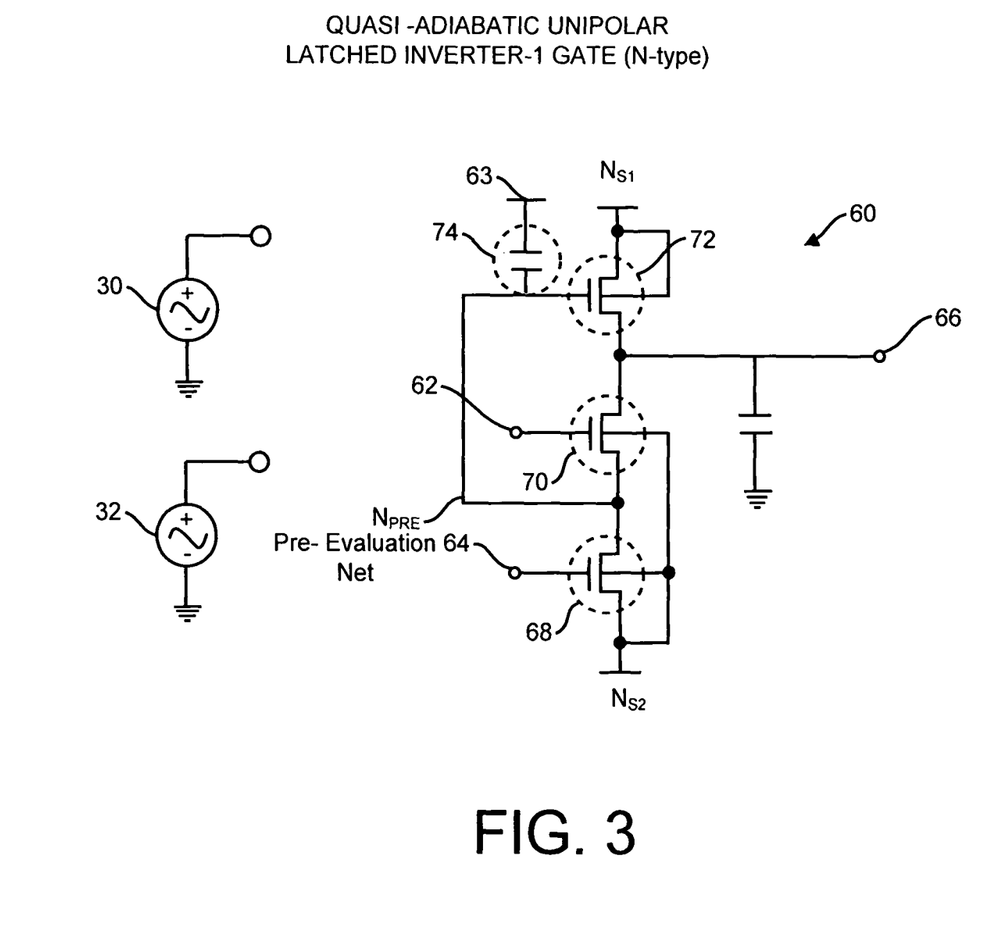
FIG. 3 is a schematic diagram of a quasi-adiabatic unipolar inverter.

FIG. 3 is a schematic diagram of a quasi-adiabatic unipolar inverter. In FIG. 3, inverter 60 includes clock input terminals 62 and 63, logic input terminal 64, and logic output terminal 66. First clock input terminal 62 is configured to receive a clock signal. Logic input terminal 64 is configured to receive a logic input signal of a binary logical nature. Logic output terminal 66 is configured to output a logic output signal of a binary logical nature. Inverter 60 also includes logic network 68 that, in the depicted embodiment (i.e. for an inverter) includes a single device of a unipolar type. Logic network 68 is configured to perform the inverter logic function. The devices of logical network 68 has a control node (e.g., gate) coupled to logic input terminal 64. Logic network 68 is configured to modulate conductivity, based on the configured logic function (e.g., inverter) and the logic input signal received on logic input terminal 64, between second supply node $N_{S2}$ (e.g., GND) and pre-evaluation net $N_{PRE}$. Also depicted are complementary sinusoidal supplies 30 and 32.

Inverter 60 includes logic clocking device 70 of the unipolar type having an input node (e.g., source/drain) coupled to pre-evaluation net $N_{PRE}$, a control node (e.g., gate) conductively coupled to first clock input terminal 62, and an output node (e.g., source/drain) coupled to logic output terminal 66. Logic clocking device 70 is configured to modulate conductivity, based on the received clock signal on first clock input terminal 62, between pre-evaluation net $N_{PRE}$ and logic output terminal 66.

Inverter 60 includes logic-complement clocking device 72 of the unipolar type having an input node (e.g., source/drain) coupled to first supply node $N_{S1}$ (e.g., VDD), a control node (e.g., gate) capacitively coupled, via capacitor 74, to second clock input terminal 63 and conductively coupled to pre-evaluation net $N_{PRE}$, and an output node (e.g., source/drain) coupled to logic output terminal 66, logic-complement clocking device 72 configured to modulate conductivity, based on the received clock signal on second clock input terminal 63, between second supply node $N_{S2}$ and logic output terminal 66.

In the depicted embodiment, pre-evaluation net $N_{PRE}$ can be charged to a voltage substantially above a voltage of second supply node $N_{S2}$ when the clock signal received on second clock input terminal 63 transitions from low to high and the conductivity of the logic network is low. If, however, the conductivity of the logic network is high or the clock signal received on second clock input terminal 63 transitions from high to low, the voltage of the pre-evaluation net will be not significantly above second supply node $N_{S2}$. If the unipolar type of the depicted devices 68, 70, and 72 is N-type, pre-evaluation net must have a voltage significantly above a voltage of second supply node $N_{S2}$ for logic-complement clocking device 72 to turn on and to provide a high conductivity path between first supply node $V_{S1}$ and logic output terminal 66.

What renders the above described logic gate 60 a quasi-adiabatic logic gate is the non-DC supply signal applied to either or both of supply nodes $N_{S1}$ and $N_{S2}$. As depicted in FIG. 3, complementary sinusoidal supply signals are generated by complementary sinusoidal supplies 30 and 32. First supply node $N_{S1}$ is sinusoidally driven by a first supply signal in phase with a first sinusoidal clock signal received on first clock input terminal 62. In some embodiments, first supply node $N_{S1}$ can be conductively coupled to first clock input terminal 62. Second supply node $N_{S2}$ is sinusoidally driven by a second supply signal in phase with the second clock signal received on second clock input terminal 63. In some embodiments, second supply node $N_{S2}$ can be conductively coupled to second clock input terminal 63.

In some embodiments the first and second supply signals can be complementary in that each of the first and second supply signals sinusoidally oscillate between the same DC voltage levels (e.g., VDD and VSS), but are approximately 180 degrees out of phase with one another. In some embodiments, only the first supply signal is non-DC. In other embodiments, only the second supply signal is non-DC. In some embodiments, first and second supply signals are sinusoids that are approximately 180 degrees out of phase with one another, but oscillate between voltage levels that are different for each of the first and second supply signals. For example the first supply signal can oscillate between VDD and a mid-level supply (e.g., the mean voltage between VDD and VSS). The second supply signal can then oscillate between the mid-level supply and VSS.

In some embodiments, the first and second clock signals provided to first and second clock terminals 62 and 63, respectively will oscillate between VDD and VSS, while the first and second supply signals will oscillate between the mid-level supply and the respective supply voltage VDD or VSS.

In some embodiments, the bodies of one or more of unitary devices 68, 70 and 72 can be conductively coupled to second supply node $N_{S2}$ as depicted. In other embodiments, the bodies of unitary devices 68, 70 and 72 can be conductively coupled to another biasing node. For example, the bodies of unitary devices 68, 70 and 72 can be conductively coupled to VSS. In other embodiments, unitary devices 68, 70 and 72 can be conductively coupled via diodes to both second supply node $N_{S2}$ and output logic terminal 18. Such a diode connection can ensure that the bodies of the devices of pulldown network 22 and pulldown clocking device 26 are not more than one diode voltage level above the voltage level of whichever of second supply node $N_{S2}$ and output logic terminal 18 that has the more negative voltage level.

Figure 4:
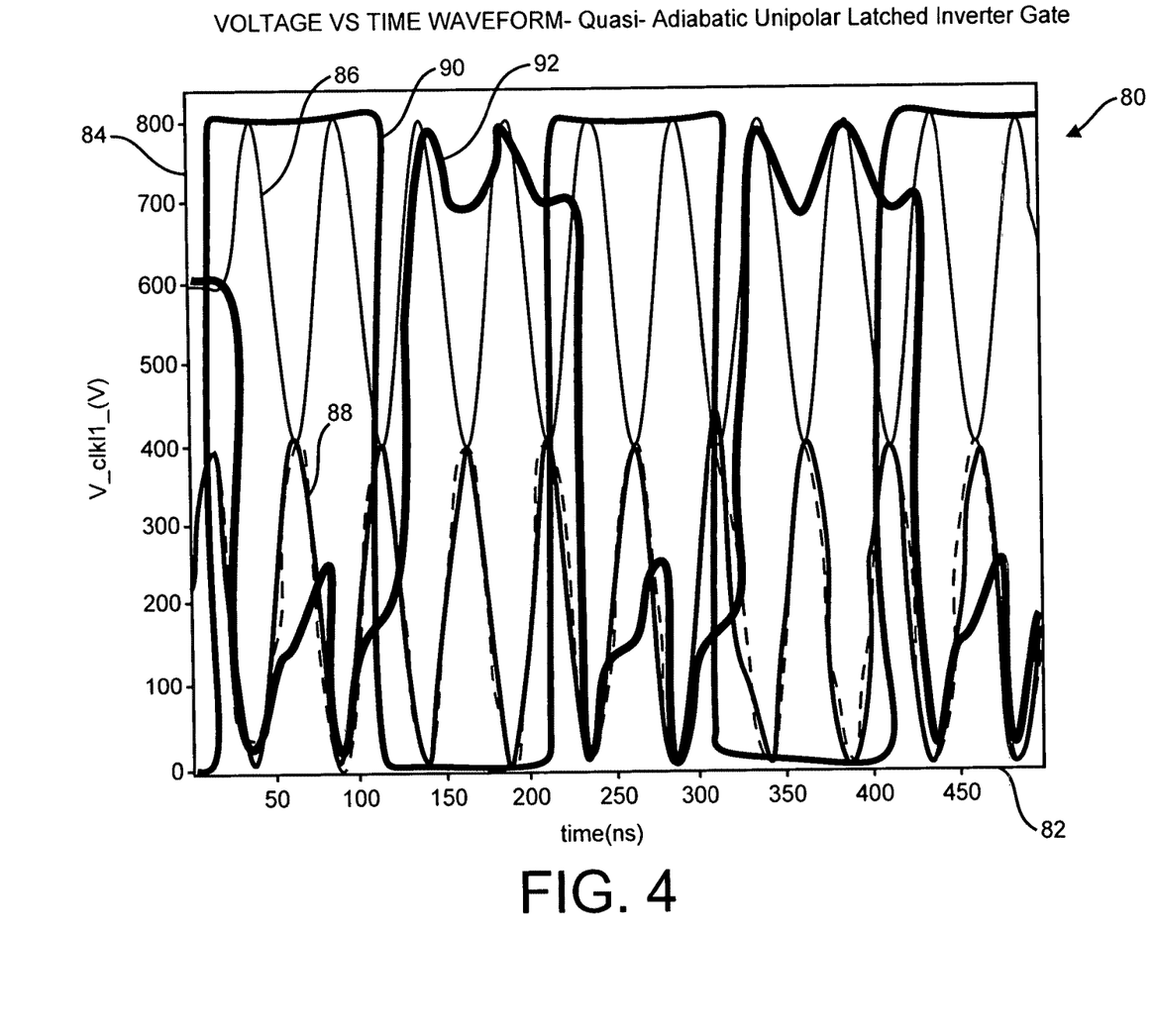
FIG. 4 is a graph of input and output signals of two series connected quasi-adiabatic unipolar inverters, such as is depicted in FIG. 3.

FIG. 4 is a graph of input and output signals of a quasi-adiabatic unipolar inverter, such as is depicted in FIG. 3. As was the case for the two series-connected adiabatic CMOS inverters above, series-connected quasi-adiabatic unipolar inverters are alternately provided sinusoidal supply signals that are complementary to adjacent logic gates. For example, the first sinusoidal clock signal is provided to first clock terminal 62 of a first of two series-connected quasi-adiabatic unipolar inverters, but to second clock terminal 63 of a second of the two series-connected quasi-adiabatic unipolar inverters. Conversely, the second sinusoidal clock signal is provided to second clock terminal 63 of the first of the two series-connected quasi-adiabatic unipolar inverters, but to first clock terminal 62 of the second of the two series-connected quasi-adiabatic unipolar inverters.

Similarly, the first supply signal is provided to first supply node $N_{S1}$ of the first of the two series-connected quasi-adiabatic unipolar inverters, but to second supply node $N_{S2}$ of the second of the two series-connected quasi-adiabatic unipolar inverters. Lastly, the second supply signal is provided to second supply node $N_{S2}$ of the first of the two series-connected quasi-adiabatic unipolar inverters, but to first supply node $N_{S1}$ of the second of the two series-connected quasi-adiabatic CMOS inverters. In this way, the second of the two series-connected quasi-adiabatic unipolar inverters transitions between logic states 180 degrees after the first of the two series-connected quasi-adiabatic unipolar inverters transitions between logic states.

In FIG. 4, graph 80 includes horizontal axis 82, vertical axis 84, and voltage/time relations 86, 88, 90 and 92. Horizontal axis 82 is indicative time, and vertical axis 84 is indicative of voltage. Voltage/time relation 86 is indicative of a first sinusoidal supply signal, that oscillates between VDD and mid-level voltage (0.8 volts and 0.4 volts, respectively, in the graph depicted). Voltage/time relation 88 is indicative of a second sinusoidal clock signal, that oscillates between mid-level voltage and VSS. Voltage/time relations 86 and 88 are complementary in that they are 180 degrees out of phase with one another, even though they oscillate between different voltage levels from one another.

Voltage/time relation 90 is indicative of the logic input voltage of quasi-adiabatic unipolar inverter. Voltage/time relation 92 is indicative of the output voltage of the quasi-adiabatic unipolar inverter. As is depicted in FIG. 4, the output logic signal indicated by voltage/time relation 50 is sufficient to cause any subsequently-connected quasi-adiabatic unipolar inverters to produce a proper output signal.

Figure 5:
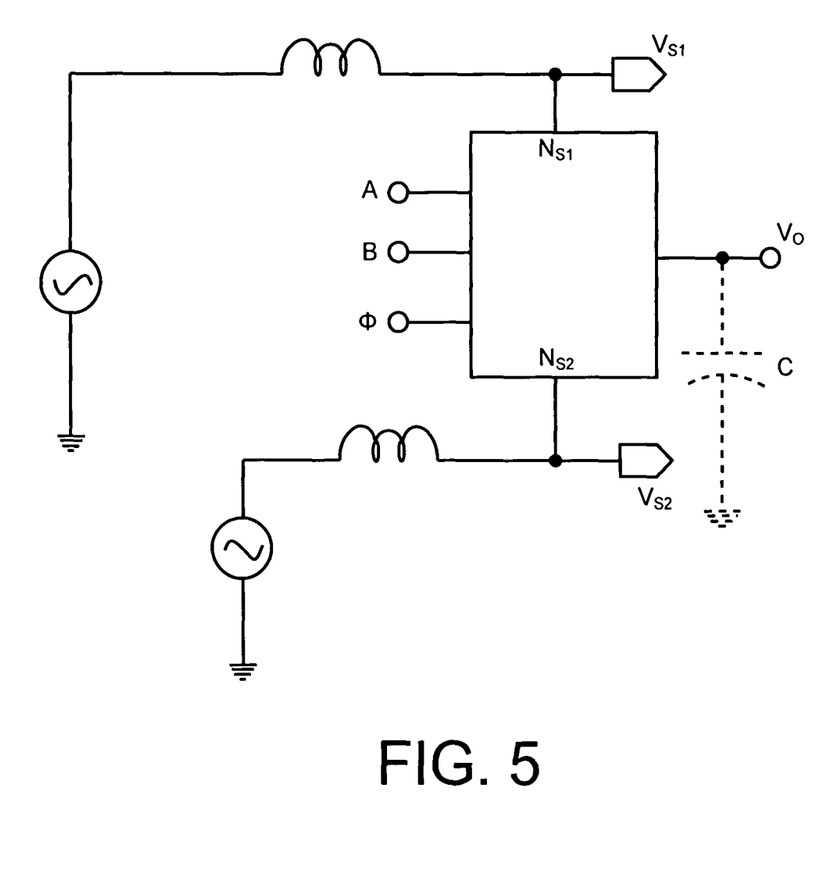
FIG. 5 is a schematic diagram depicting sinusoidally driven power provided to a quasi-adiabatic logic gate via inductors.

FIG. 5 is a schematic diagram depicting sinusoidally driven power provided to a quasi-adiabatic logic gate via inductors. In FIG. 5, adiabatic system 100 includes first sinusoidal power generator 102, second sinusoidal power generator 104, logic circuitry 106, and inductors 108 and 110. Logic circuitry 106 has first and second supply nodes $N_{S1}$ and $N_{S2}$, logic input terminals A and B, clock input terminal φ, and logic output terminal $V_O$. First and second sinusoidal power generators generate power that is out of phase with one another. Such complementary power signals are provided to logic circuitry 106 via inductors 108 and 110. Inductors 108 and 110 effectively create a tank circuit with capacitance C, which represents the parasitic capacitance of all internal nodes that are switched in response to one or more clock signals provided to clock input terminal φ. Inductors 108 and 110 can be tuned to match capacitance C and the switching frequency of the one or more clock signals provided to clock input terminal φ, so as to conserve charge.

In some embodiments, only one inductor will be used to provide power to only one of first and second supply nodes $N_{S1}$ and $N_{S2}$. In some embodiments, capacitance C and/or inductors 108 and 110 can be tuned so as to minimize power consumption of adiabatic system 100.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A quasi-adiabatic logic gate comprising:
   first and second clock input terminals configured to receive complementary first and second sinusoidal clock signals, respectively;
   one or more logic input terminals configured to receive one or more corresponding logic input signals;
   a logic output terminal configured to output a logic output signal;
   a pullup network including one or more pullup devices configured to perform a pullup logic function, each of the one or more devices of the pullup network having a control node coupled to a corresponding one of the logic input terminals, the pullup network configured to modulate conductivity between a first supply node and an intermediate pullup node based on the pullup logic function that the pullup network is configured to perform and the logic input signals received on the logic input terminals;
   a pulldown network including one or more pulldown devices configured to perform a pulldown logic function that is the complement of the pullup logic function performed by the pullup network, each of the one or more devices of the pulldown network having a control node coupled to a corresponding one of the logic input terminals, the pulldown network configured to modulate conductivity between a second supply node and an intermediate pulldown node based on the pulldown logic function that the pulldown network is configured to perform and the logic input signals received on the logic input terminals;
   a pullup clocking device having a pullup control node coupled to the first clock terminal, the pullup clocking device having a control node coupled to the first clock input terminal, the pullup clocking device configured to modulate conductivity, based on a first sinusoidal clock signal received on the first clock terminal, between the intermediate pullup node and a logic output terminal;
   a pulldown clocking device having a pulldown control node coupled to the second clock terminal, the pulldown clocking device having a control node coupled to the second clock input terminal, the pulldown clocking device configured to modulate conductivity, based on a second sinusoidal clock signal received on the second clock terminal, between the intermediate pulldown node and a logic output terminal;

wherein the first supply node is sinusoidally driven by a first supply signal in phase with the second sinusoidal clock signal, and wherein the second supply node is sinusoidally driven by a second supply signal in phase with and the first clock signal.

2. The quasi-adiabatic logic gate of claim 1, wherein the first supply node is conductively coupled to the pulldown control node, and the second supply node is conductively coupled to the pullup control node.

3. The quasi-adiabatic logic gate of claim 1, wherein the first supply signal driving the first supply node oscillates between a first DC voltage and a second DC voltage, and wherein the second supply signal driving the second supply node oscillates between the second DC voltage and the first DC voltage.

4. The quasi-adiabatic logic gate of claim 3, wherein body nodes of the one or more PMOS devices of the pullup network and the pullup clocking device are driven by the first DC voltage, and body nodes of the one or more NMOS devices of the pulldown network and the pulldown clocking device are driven by the second DC voltage.

5. The quasi-adiabatic logic gate of claim 1, wherein the first supply signal driving the first supply node oscillates between a first DC voltage and an intermediate DC voltage between the first and a second DC voltages, and wherein the second supply signal driving a second supply node oscillates between the second DC voltage and the intermediate DC voltage.

6. The quasi-adiabatic logic gate of claim 5, wherein body nodes of the one or more PMOS devices of the pullup network and the pullup clocking device are driven by the first DC voltage, and body nodes of the one or more NMOS devices of the pulldown network and the pulldown clocking device are driven by the second DC voltage.

7. The quasi-adiabatic logic gate of claim 1, wherein body nodes of the one or more PMOS devices of the pullup network and the pullup clocking device are diode coupled to both the first supply node and the logic output terminal, and body nodes of the one or more NMOS devices of the pulldown network and the pulldown clocking device are diode coupled to both the second supply node and the logic output terminal.

8. The quasi-adiabatic logic gate of claim 1, further comprising:
a clock generator having first and second output nodes, the clock generator configured to provide the first sinusoidal clock signal at the first output node and the second sinusoidal clock signal at the and second output node.

9. The quasi-adiabatic logic gate of claim 8, further comprising:
an inductor coupled between the first output node of the clock generator and the first supply node.

10. The quasi-adiabatic logic gate of claim 9, wherein the inductor is a first inductor, the quasi-adiabatic CMOS logic gate further comprising:
a second inductor coupled between the second output node of the clock generator and the second supply node.

11. The quasi-adiabatic logic gate of claim 8, further comprising:
an inductor coupled between the second output node of the clock generator and the second supply node.

12. A method for generating an electronic logic state:
receiving, via first and second clock input terminals, complementary first and second sinusoidal clock signals, respectively;
receiving, via one or more logic input terminals, one or more corresponding logic input signals;
configuring a pullup network including one or more pullup devices to perform a pullup logic function;
modulating conductivity, via the pullup network, between a first supply node and an intermediate pullup node based on the pullup logic function that the pullup network is configured to perform and the logic input signals received on the logic input terminals;
configuring a pulldown network including one or more pulldown devices to perform a pulldown logic function that is the complement of the pullup logic function performed by the pullup network;
modulating conductivity, via the pulldown network, between a second supply node and an intermediate pulldown node based on the pulldown logic function that the pulldown network is configured to perform and the logic input signals received on the logic input terminals;
modulating conductivity, via a pullup clocking device having a pullup control node, between the intermediate pullup node and a logic output terminal based on a signal received on the pullup control node;
modulating conductivity, via a pulldown clocking device having a pulldown control node, between the intermediate pulldown node and the logic output terminal based on a signal received on the pulldown control node;
sinusoidally driving the first supply node by a first supply signal in phase with the second sinusoidal clock signal;
sinusoidally driving the second supply node by a second supply signal in phase with and the first clock signal; and
outputting a logic output signal at a logic output terminal.

13. The method of claim 12, further comprising:
conductively coupling the first supply node to the pulldown control node; and
conductively coupling the second supply node to the pullup control node.

14. The method of claim 12, wherein sinusoidally driving the first supply node comprises:
oscillating the first supply signal between a first DC voltage and a second DC voltage,
and wherein sinusoidally driving the second supply node comprises:
oscillating the second supply signal between the second DC voltage and the first DC voltage.

15. The method of claim 14, further comprising:
driving body nodes of the one or more PMOS devices of the pullup network and the pullup clocking device by the first DC voltage; and
driving body nodes of the one or more NMOS devices of the pulldown network and the pulldown clocking device by the second DC voltage.

16. The method of claim 12, wherein sinusoidally driving the first supply node comprises:
oscillating the first supply signal driving the first supply node between a first DC voltage and an intermediate DC voltage between the first and a second DC voltages,
and wherein sinusoidally driving the second supply node comprises:

oscillating the second supply signal between the second DC voltage and the intermediate DC voltage.

17. The method of claim 16, further comprising:
driving body nodes of the one or more PMOS devices of the pullup network and the pullup clocking device by the first DC voltage; and
driving body nodes of the one or more NMOS devices of the pulldown network and the pulldown clocking device by the second DC voltage.

18. The method of claim 12, further comprising:
diode coupling body nodes of the one or more PMOS devices of the pullup network and the pullup clocking device to both the first supply node and the logic output terminal; and
diode coupling body nodes of the one or more NMOS devices of the pulldown network and the pulldown clocking device to both the second supply node and the logic output terminal.

19. The method of claim 12, further comprising:
providing, via a clock generator having first and second output nodes, the first sinusoidal clock signal at the first output node and the second sinusoidal clock signal at the and second output node.

20. The method of claim 12, further comprising:
coupling an inductor between the first output node of the clock generator and the first supply node.

21. The method of claim 12, wherein the inductor is a first inductor, the method further comprising:
coupling a second inductor between the second output node of the clock generator and the second supply node.

22. The method of claim 12, further comprising:
coupling an inductor between the second output node of the clock generator and the second supply node.

23. A quasi-adiabatic logic gate comprising:
first and second clock input terminals configured to receive complementary first and second clock signals, each of the first and second clock signals having a triangular or trapezoidal waveform, respectively;
one or more logic input terminals configured to receive one or more corresponding logic input signals;
a logic output terminal configured to output a logic output signal;
a pullup network including one or more pullup devices configured to perform a pullup logic function, each of the one or more devices of the pullup network having a control node coupled to a corresponding one of the logic input terminals, the pullup network configured to modulate conductivity between a first supply node and an intermediate pullup node based on the pullup logic function that the pullup network is configured to perform and the logic input signals received on the logic input terminals;
a pulldown network including one or more pulldown devices configured to perform a pulldown logic function that is the complement of the pullup logic function performed by the pullup network, each of the one or more devices of the pulldown network having a control node coupled to a corresponding one of the logic input terminals, the pulldown network configured to modulate conductivity between a second supply node and an intermediate pulldown node based on the pulldown logic function that the pulldown network is configured to perform and the logic input signals received on the logic input terminals;
a pullup clocking device having a pullup control node coupled to the first clock terminal, the pullup clocking device having a control node coupled to the first clock input terminal, the pullup clocking device configured to modulate conductivity, based on a first clock signal received on the first clock terminal, between the intermediate pullup node and a logic output terminal;
a pulldown clocking device having a pulldown control node coupled to the second clock terminal, the pulldown clocking device having a control node coupled to the second clock input terminal, the pulldown clocking device configured to modulate conductivity, based on a second clock signal received on the second clock terminal, between the intermediate pulldown node and a logic output terminal;
wherein the first supply node is driven by a first supply signal in phase with the second clock signal, and wherein the second supply node is driven by a second supply signal in phase with and the first clock signal.

* * * * *